(12) United States Patent
Beddingfield et al.

(10) Patent No.: US 11,196,338 B2
(45) Date of Patent: Dec. 7, 2021

(54) SEMICONDUCTOR TOPOLOGIES AND DEVICES FOR SOFT STARTING AND ACTIVE FAULT PROTECTION OF POWER CONVERTERS

(71) Applicant: North Carolina State University, Raleigh, NC (US)

(72) Inventors: Richard B. Beddingfield, Raleigh, NC (US); Subhashish Bhattacharya, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 16/958,959

(22) PCT Filed: Dec. 29, 2018

(86) PCT No.: PCT/US2018/068069
§ 371 (c)(1),
(2) Date: Jun. 29, 2020

(87) PCT Pub. No.: WO2019/133939
PCT Pub. Date: Jul. 4, 2019

(65) Prior Publication Data
US 2020/0343809 A1    Oct. 29, 2020

Related U.S. Application Data

(60) Provisional application No. 62/611,806, filed on Dec. 29, 2017.

(51) Int. Cl.
*H03K 17/72* (2006.01)
*H02M 1/36* (2007.01)
(Continued)

(52) U.S. Cl.
CPC ............... *H02M 1/36* (2013.01); *H02M 1/32* (2013.01); *H02M 7/1557* (2013.01); *H03K 17/08124* (2013.01); *H03K 17/164* (2013.01)

(58) Field of Classification Search
CPC ........ H02M 1/36; H02M 1/32; H02M 7/1557; H03K 17/08124; H03K 17/164
(Continued)

(56) References Cited

U.S. PATENT DOCUMENTS 3,467,848 A * 9/1969 Desmond ................. H02J 3/36
363/51
4,757,436 A * 7/1988 Ueda .................. H02M 7/1626
363/54
(Continued)

OTHER PUBLICATIONS

Koellner, Walter, "A New All AC Gearless Drive System for Large Mining Draglines", Business Manager Mining, Siemens Energy & Automation Inc. (Oct. 2006).
(Continued)

*Primary Examiner* — Metasebia T Retebo
(74) *Attorney, Agent, or Firm* — Thomas | Horstemeyer, LLP

(57) ABSTRACT

Various examples are provided related to semiconductor topologies and devices that can be used for soft starting and active fault protection of power converters. In one example, an active switch device includes an active switch having a gating control input; and a thyristor having a gating control input. The thyristor is coupled in parallel with the active switch. The active switch can be an IGBT, MOSFET, or other appropriate device. In another example, a power converter can include the active switch devices and switching control circuitry coupled to gating control inputs of the active switch devices.

19 Claims, 10 Drawing Sheets

(51) Int. Cl.
*H02M 1/32* (2007.01)
*H02M 7/155* (2006.01)
*H03K 17/0812* (2006.01)
*H03K 17/16* (2006.01)

(58) Field of Classification Search
USPC .......................................................... 327/427
See application file for complete search history.

(56) References Cited

U.S. PATENT DOCUMENTS

| | | | | |
|---|---|---|---|---|
| 6,326,648 | B1* | 12/2001 | Jalade | H01L 27/0623 |
| | | | | 257/130 |
| 6,411,529 | B1* | 6/2002 | Svensson | H02M 7/757 |
| | | | | 361/101 |
| 7,298,102 | B2 | 11/2007 | Sopko et al. | |
| 7,768,758 | B2 | 8/2010 | Maier et al. | |
| 9,197,139 | B2* | 11/2015 | Hart | H02M 1/32 |
| 2012/0242153 | A1* | 9/2012 | Papastergiou | H02M 1/32 |
| | | | | 307/77 |

OTHER PUBLICATIONS

Beddingfield, et al., "Investigation of Series DC Active Filter and Hybrid AC Active Filter Performance in Medium Voltage DC Amplifier", Future Renewable Electric Energy Delivery and Management (FREEDM) Systems Center, North Carolina State University (Jul. 2015).

Parkhideh, et al., "Enabling Energy Storage Integration in High Power Multi-Motor Applications with Active Filter Solutions", Future Renewable Electric Energy Delivery and Management (FREEDM) System Center, North Carolina State University (Oct. 2011).

Parkhideh, et al., "Hybrid Front End Converters for Large Multi-Motor Applications Integrated with Energy Storage", National Science Foundation Future Renewable Electric Energy Delivery and Management Systems Center, North Carolina State University (Mar. 2012).

Rodriguez, et al., "Operating Experience of Shovel Drives for Mining Applications", IEEE Transactions on Industry Applications, Mar./Apr. 2004, vol. 40, No. 2.

Mirzaee, et al., "Performance Investigation of Hybrid Converter Systems for Mobile Mining Applications", ECE Department, North Carolina State University, University of North Carolina-Charlotte (Sep. 2013).

International Search Report and Written Opinion dated Apr. 1, 2019 in co-pending PCT Patent Application No. PCT/US2018/068069.

* cited by examiner

SEMICONDUCTOR TOPOLOGIES AND DEVICES FOR SOFT STARTING AND ACTIVE FAULT PROTECTION OF POWER CONVERTERS

CROSS-REFERENCE TO RELATED APPLICATIONS

The present application is a national stage entry pursuant to 35 U.S.C. § 371 of International Application No. PCT/US2018/068069, filed on Dec. 29, 2018, which claims priority to, and the benefit of, U.S. Provisional Application No. 62/611,806, filed on Dec. 29, 2017 and entitled "SEMICONDUCTOR TOPOLOGIES AND DEVICES FOR SOFT STARTING AND ACTIVE FAULT PROTECTION OF POWER CONVERTERS", both of which are hereby incorporated by reference herein in their entireties.

STATEMENT REGARDING FEDERALLY SPONSORED RESEARCH OR DEVELOPMENT

This invention was made with government support under grant number DE-EE0007508 awarded by the Department of Energy. The government has certain rights to this invention.

BACKGROUND

AC-DC converters are used to power transfer between alternating current (AC) and direct current (DC) in power conversion and distribution systems through the use of active switching. Very large transient current and voltage excursions can occur during starting or fault situations. These in-rush and transient currents and voltages can overstress semiconductors and damage other components in the AC-DC converters.

SUMMARY

Aspects of the present disclosure are related to semiconductor topologies and devices that can be used for soft starting and active fault protection of power converters such as, e.g., AC-DC converters and solid state transformers.

In one aspect, among others, an active switch device comprises an active switch comprising a gating control input; and a thyristor comprising a gating control input, the thyristor coupled in parallel with the active switch. In some aspects, the active switch can be an insulated-gate bipolar transistor (IGBT). A cathode of the thyristor can be electrically connected to a collector of the IGBT and an anode of the thyristor can be electrically connected to an emitter of the IGBT. In various aspects, the active switch can be a metal-oxide-semiconductor field-effect transistor (MOSFET). A cathode of the thyristor can be electrically connected to a source of the MOSFET and an anode of the thyristor can be electrically connected to a drain of the MOSFET. The active switch device can comprise an enable switch connected in series with the MOSFET and the thyristor can be coupled in parallel with the active switch and the enable switch.

In one or more aspects, switching control circuitry can provide a gate signal to the gating control input of the thyristor to control a firing angle of the thyristor. The gate signal can provide a ramp increase in response to a charge on a DC bus. The gate signal can be held at a constant level when the DC bus charge reaches a defined level. The switching control circuitry can provide a second gate signal to the gating control input of the active switch for pulse width modulation (PWM) operation while the firing angle of the thyristor is held constant. The switching control circuitry can turn off the thyristor in response to detection of a fault condition on the DC bus. The fault condition can be a current threshold.

In another aspect, a power converter comprises one or more active switch devices and switching control circuitry coupled to gating control inputs of the active switch devices. In various aspects, the switching control circuitry can control firing angles of thyristors of the active switch devices in response to one or more operational conditions of the power converter. The firing angles of the thyristors can be decreased over time in response to starting of the power converter. The firing angles can be linearly decreased over a defined period of time. The firing angles can be decreased from pi radians. The firing angle can be decreased to zero radians at steady state operation. Gating of the thyristors can be de-energized in response to detection of a fault condition. In some aspects, the switching control circuitry can control firing angles of thyristors of the active switch devices in response to a charge on a DC bus electrically connected to the active switch devices. The switching control circuitry can turn off the thyristor of the active switch devices in response to detection of a fault condition. The power converter can be an H-bridge boost rectifier, other AC-DC converter or solid state transformer.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1A:
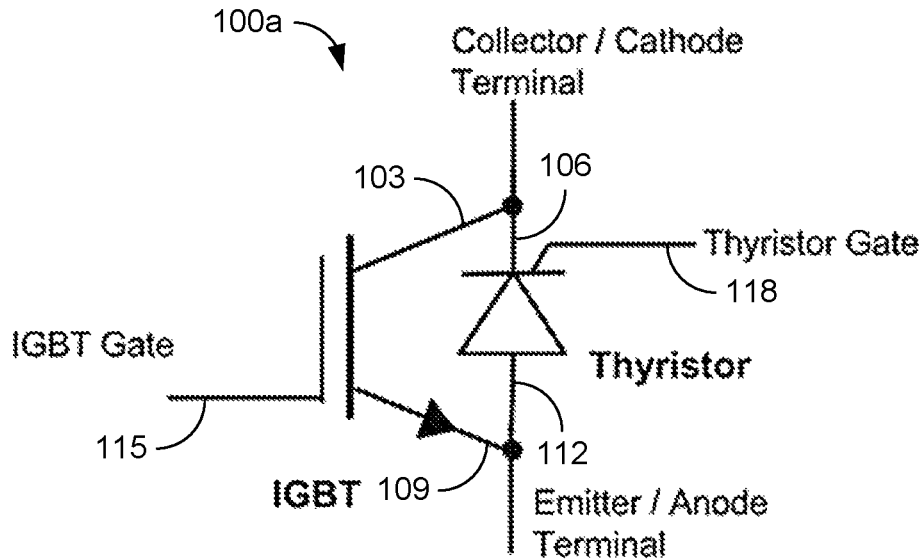
FIGS. 1A-1H are schematic diagrams illustrating examples of active switch devices comprising a thyristor in parallel with the active switch, in accordance with various embodiments of the present disclosure.

Disclosed herein are various examples related to semiconductor topologies and devices that can be used for soft starting and active fault protection of power converters such as, e.g., AC-DC converters and solid state transformers. Reference will now be made in detail to the description of the embodiments as illustrated in the drawings, wherein like reference numbers indicate like parts throughout the several views.

Figure 1B:
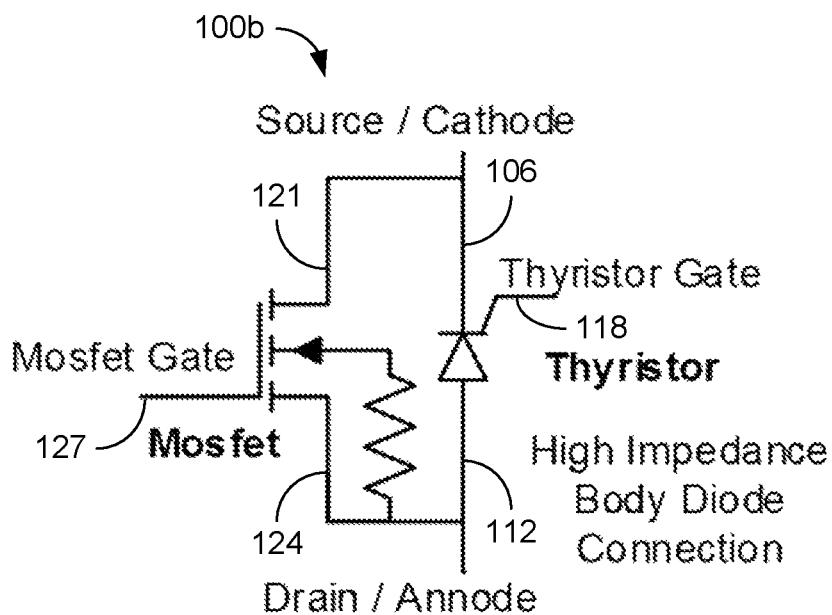
Figure 1C:
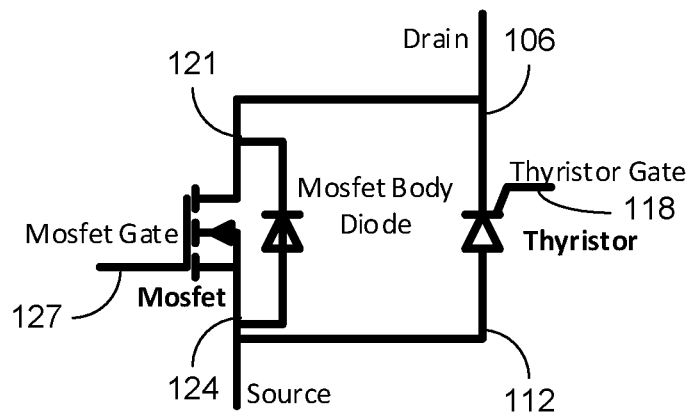

Bidirectional AC-to-DC converters often utilize a freewheeling diode in parallel with an active switch to mitigate the current and voltage excursions that can occur. The freewheeling diodes permit current to flow (e.g., lagging currents from inductive loads) even if the switches are open. In the disclosed topologies, the diode is replaced by a thyristor in parallel with the active switch such as, e.g., an IGBT or MOSFET as illustrated in FIGS. 1A and 1B. For the IGBT/thyristor device 100a shown in FIG. 1A, the IGBT collector 103 is connected to the thyristor cathode 106 and the IGBT emitter 109 is connected to the thyristor anode 112. The gate 115 of the IGBT and the gate 118 of the thyristor are pulled out for control signals. The thyristor replaces a traditional antiparallel diode to act as an on time-controlled diode. This configuration can also work with IGCTs, GTOs, other variations of IGBTs such as, e.g., IEGT devices, or other types of BJT semiconductor devices that do not include a body diode as part of the switch chemistry.

Figure 1D:
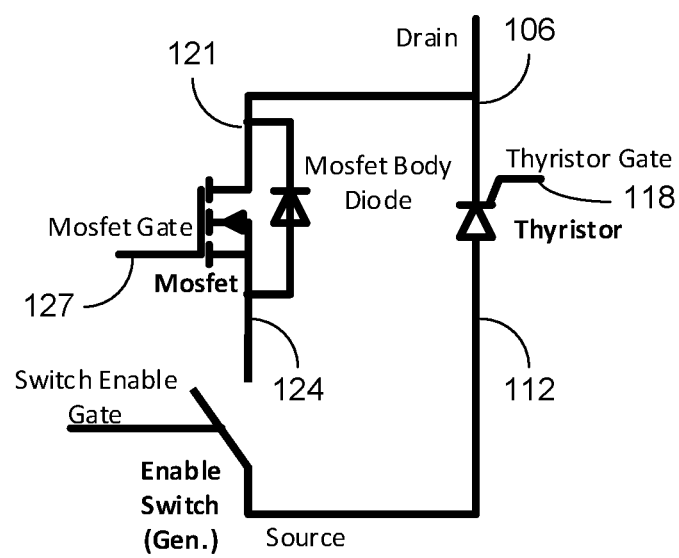

In a similar a similar way, the MOSFET/thyristor device 100b shown in FIG. 1B includes a source 121 connected to the thyristor cathode 106 and a drain 124 connected to the thyristor anode 112. Again, the gate 127 of the MOSFET and the gate 118 of the thyristor are brought out for control signals. FIG. 10 shows an example of a MOSFET device including a body diode. One concern is conduction of the MOSFET body diode when the $V_{S-D} > V_{Body\ Diode}$. FIG. 1D illustrates a generalized example of the MOSFET/thyristor device of FIG. 10 including an enable switch at the drain 124 of the MOSFET. The configuration depends on the function of converter that the switch combination is desired to apply to. If the DC link is rated for less than the peak AC line voltage, the converter is a buck type. If it is rated for higher, then the converter is a boost type.

Figure 1E:
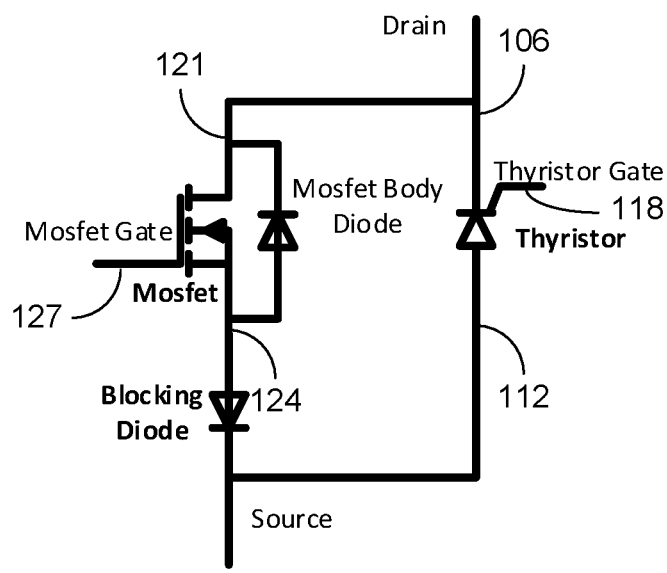

FIG. 1E illustrates an example of a buck type converter configuration. Here, a blocking diode (e.g., a body diode) is added anti-series to the MOSFET. This prevents the MOSFET body diode from conducting. The thyristor will bridge both the MOSFET and the anti-series diode. In this configuration, the thyristor can be gated to pre-charge the DC link. The MOSFET gate 127 remains ungated (off) during the entire recharge time. During normal operation, the thyristor need not be gated at all while the DC link is supplied from external sources, e.g., solar photovoltaics, battery, diesel generators, other nodes of a multi-terminal DC link, etc.

Figure 1F:
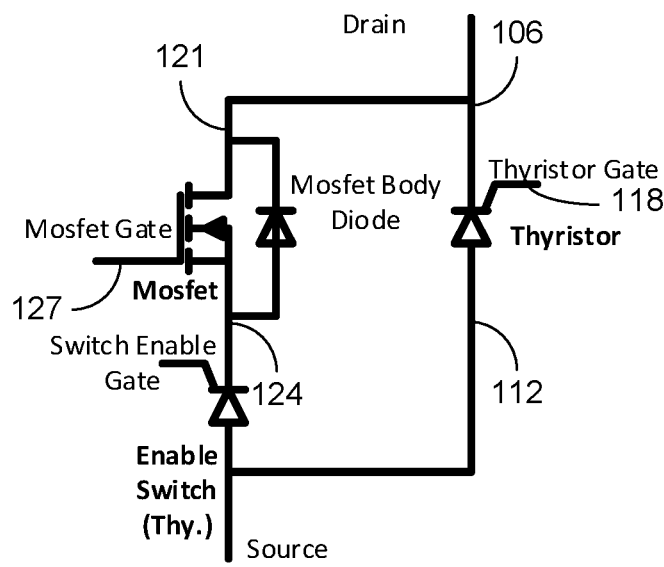
Figure 1G:
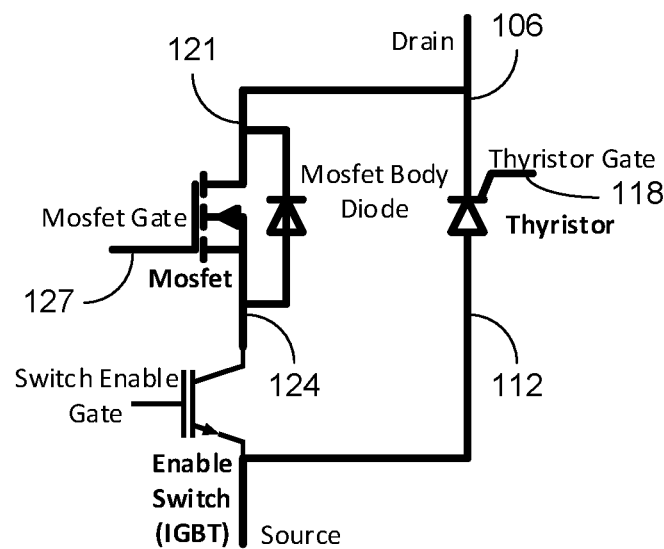

FIGS. 1F and 1G illustrate examples of boost type converter configurations. Like the buck type of FIG. 1E, a series device is added to the MOSFET and the thyristor is connected in parallel. In this case, the series device is an enabling switch, which can be chosen for low conduction losses and forward drop only. This enable switch will nominally only switch twice:

From off to on after the parallel thyristor has pre-charged the DC bus to a nominal level. The enable switch remains on as the MOSFET begins switching at high frequencies for typical converter operation; and From on to off during fault conditions. Once a fault condition is identified, the enable switch should turn off. With the thyristor also turned off, the fault on the DC bus will begin to extinguish as it cannot be fed from the AC side.

Several options are available for the enable switch. In the example of FIG. 1F, a thyristor is used, and in the example of FIG. 1G, an IGBT is used. Since these devices switch very infrequently, switching losses may not be a concern.

Figure 1H:
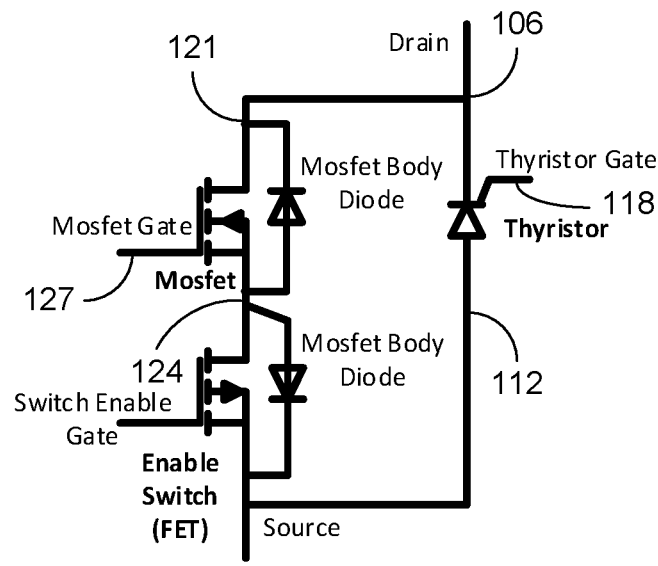

FIG. 1H illustrates an example of a hybrid buck-boost type converter configuration. This configuration enables a single switch combination to fill three different roles: buck, boost, and buck-boost. Here, two MOSFET devices of different types are connected in series. That is, an N-channel and a P-channel MOSFET are connected in series. This results in the body diodes of the two devices being connected in anti-series, preventing undesired conduction. Again, the thyristor is parallel to the combination and provides a controlled pre-charge to the DC link.

The disclosed semiconductor topologies and devices 100 for soft starting and active fault protection of AC-DC converters can improve performance across several converter types and topologies. The use of the thyristor enables the function of a controlled diode in a power converter. By actively controlling the operation of the thyristor, it is possible to limit the in-rush or transient current flow through the device 100. Thyristors with very high voltage blocking capabilities and current ratings, which are commonly available, robust and cheaply manufactured, can be used for these configurations. The active switch device 100 can be equally applied to applications at high voltage and/or low power with appropriate selection of the component capabilities.

The disclosed devices 100 can replace auxiliary charge circuits that are necessary in silicon carbide (SiC) power converters, or used in other circuits or devices. It can protect SiC diodes from over current scenarios. The disclosed configuration can also enable DC fault protection inside the power converter without the need for an additional DC or AC circuit breaker. Grid disconnection of the DC bus can be enabled by the power converter enabling a mechanical switch to fully de-energize the converter without the need of an AC circuit breaker.

These designs allow for replacement of only a few selected switches in a variety of converters to achieve the desired effects. This can be as significant as half the switches (e.g., two), as is the case in a single phase H bridge, or a very small proportion as is the case in modular multi-level converters (MMC) where six switches could cover the three legs of 100 s of switches. It should be noted that this switch combo is not a switch in addition to the traditional switch in a converter. Rather, a switch and diode combination is replaced with a switch and thyristor combo. A few design examples include:

3 and 5 Level neutral point clamped (NPC) voltage source converter (VSC)—in general, any n-level NPC VSC will work for such circuits;

3 and 5 Level capacitor clamped (CC) VSC—in general, n-level CC VSC will work for such circuits; and Cascaded multi-level converters (C-MLC), which can be with or without a DAB converter following it (regardless of if the DC links are in parallel or in series).

In general the switch combination and control scheme can provide smooth startup and fault mode operation of any solid state transformer (SST), and for any active front end (AFE) converter system. It is also can provide grid tied soft starting without any existing energy storage connected. This can be important for multi-terminal DC links, high voltage DC transmission or other AC-DC converters where the grid is the principal energy source. It also provides advantages for the MMC system and CMC extension in light of the commercial activity with these converter systems.

Figure 2A:
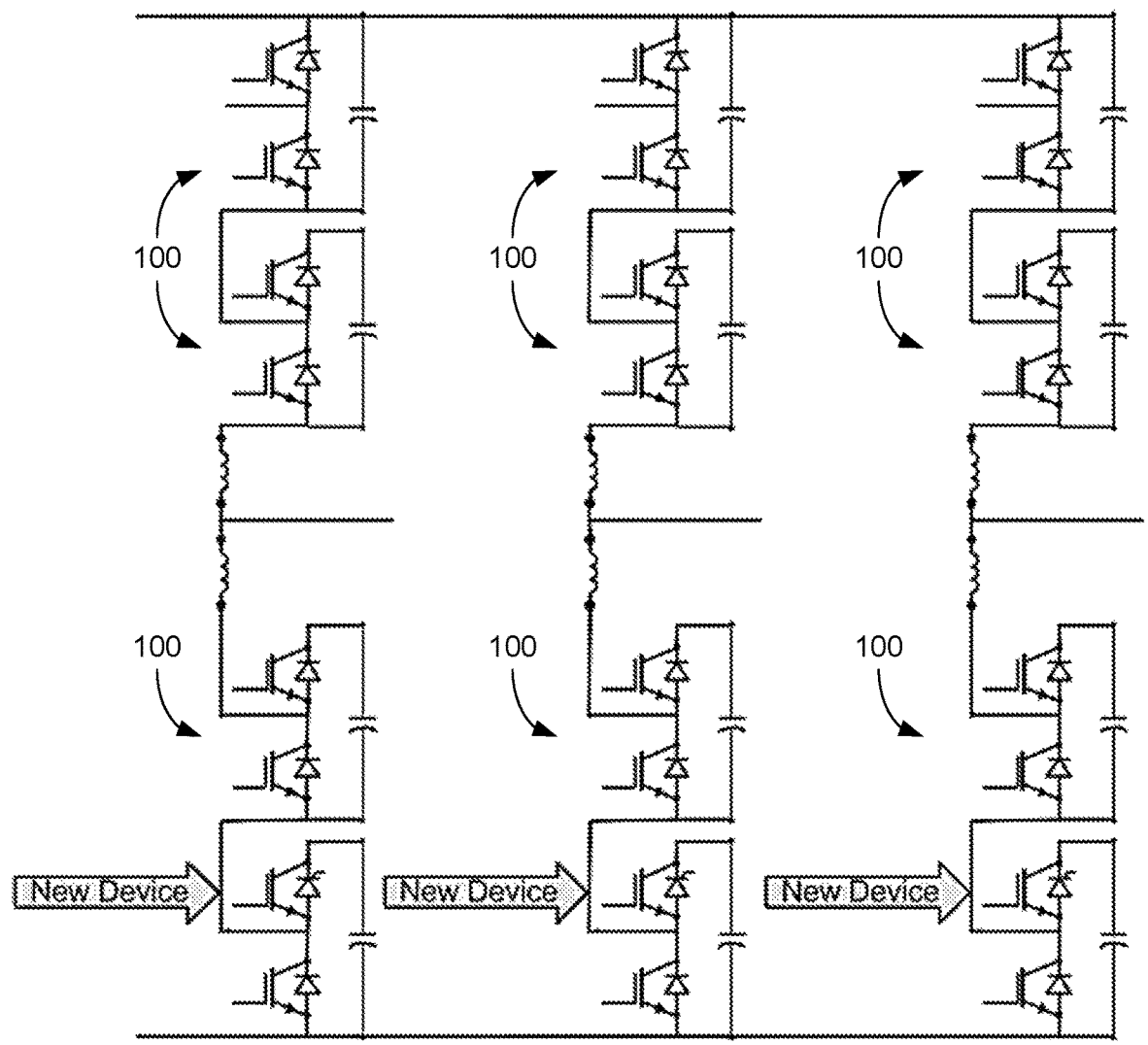
FIGS. 2A-2C are schematic diagrams illustrating examples of power converters including active switch devices of FIGS. 1A and 1B, in accordance with various embodiments of the present disclosure.

The active switch/thyristor devices 100 can be applied to a variety of AC-to-DC converters. Referring next to FIG. 2A, shown is a schematic diagram illustrating an example of a modular multi-level converter topology utilizing an active switch device 100 (e.g., device 100a of FIG. 1A). Not shown in the schematic diagram is switching control circuitry coupled to the gates of the active switch and thyristor. The switching control circuitry can be implemented using processing circuitry comprising, e.g., one or more processor, discrete logic circuit, application specific integrated circuit (ASIC), programmable gate array (PGA), field programmable gate array (FPGA), etc.

Figure 2B:
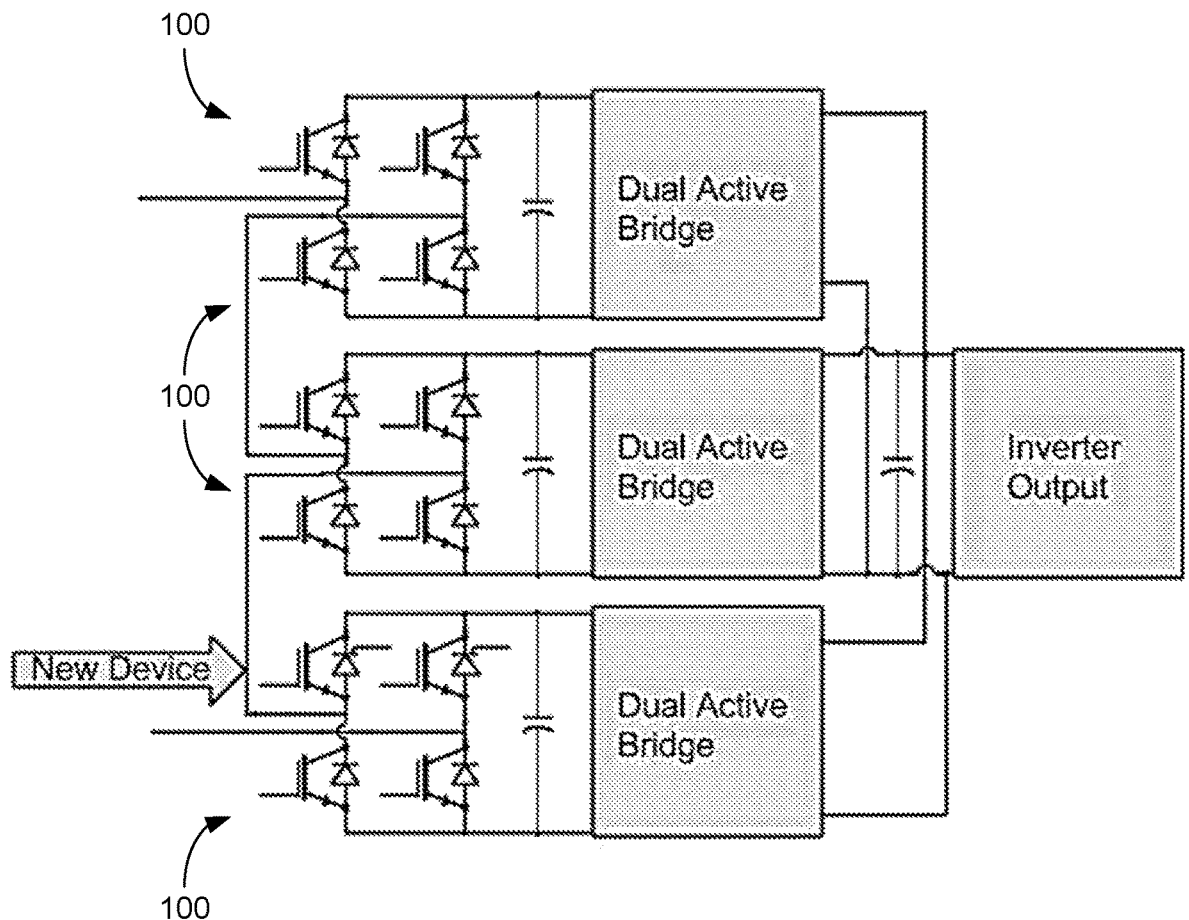
Figure 2C:
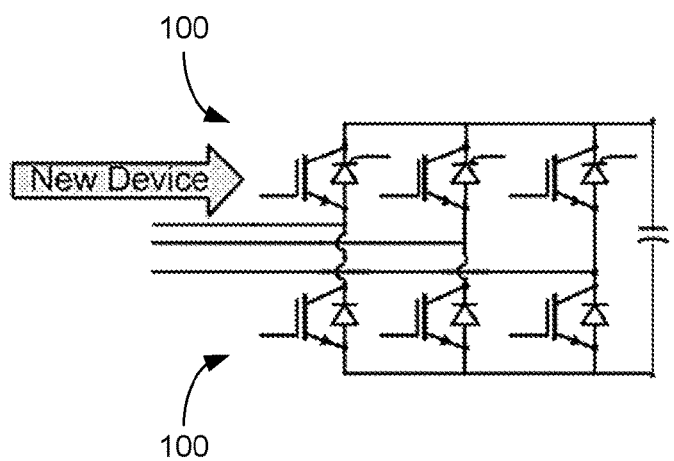

Referring next to FIG. 2B, shown is a schematic diagram illustrating an example of a solid state transformer utilizing an active switch device 100 (e.g., device 100a of FIG. 1A). FIG. 2C shows a schematic diagram illustrating an example of a 3-phase converter utilizing an active switch device 100 (e.g., device 100a of FIG. 1A). Not shown in the schematic diagrams is the switching control circuitry coupled to the gates of the active switch and thyristor. In addition to the non-exhaustive examples of FIGS. 2A-2C, the active switch device 100 can also be applied to other types of converters and/or topologies (including existing power converter architectures) for power conversion.

For example, "Enabling Energy Storage Integration in High Power Multi-Motor Applications with Active Filter Solutions" by Parkhideh et al. (*IEEE Industry Applications Society Annual Meeting*, October 2011), which is hereby incorporated by reference in its entirety, presents a traditional approach that charges the DC bus with external energy storage. Use of the active switch device 100 can eliminate the need for the external system or allow it to focus on peak shaving. "Performance Investigation of Hybrid Active Filter During Low Load Condition" by Beddingfield et al. (IEEE Energy Conversion Congress and Exposition, October 2017) describes a control and mechanical switch method of synchronizing and soft switching. The active switch device 100 can be used to soft start the DC bus and then the IGBT active filter can connect and begin operation.

These active switch devices 100 can be used for soft starting, where they can replace a separate charge circuit. Commutating the thyristor with the AC mains and utilizing a ramp increase to control the firing angle allows a slow ramp of current magnitude to pass through the thyristor and additional diodes in the power converter. Once the DC bus is charged to the desired level, the firing angle can be held at this level. At that point, the power converter can begin PWM based operation of the active switches.

Since the thyristor can be commutated for less than full conduction, this enables buck operation of the power converter. If, classic operation of the power converter is needed, the thyristor can be commutated at 180 degrees or always on and thus behave like the diode it replaces. In the case of a fault on a DC bus of the power converter, turning off the thyristor commutation can prevent power flow through the remaining diodes. This will halt current within one half cycle of the AC wave and cause a collapse of the DC bus and subsequent decay of DC current feeding the fault.

Figure 3:
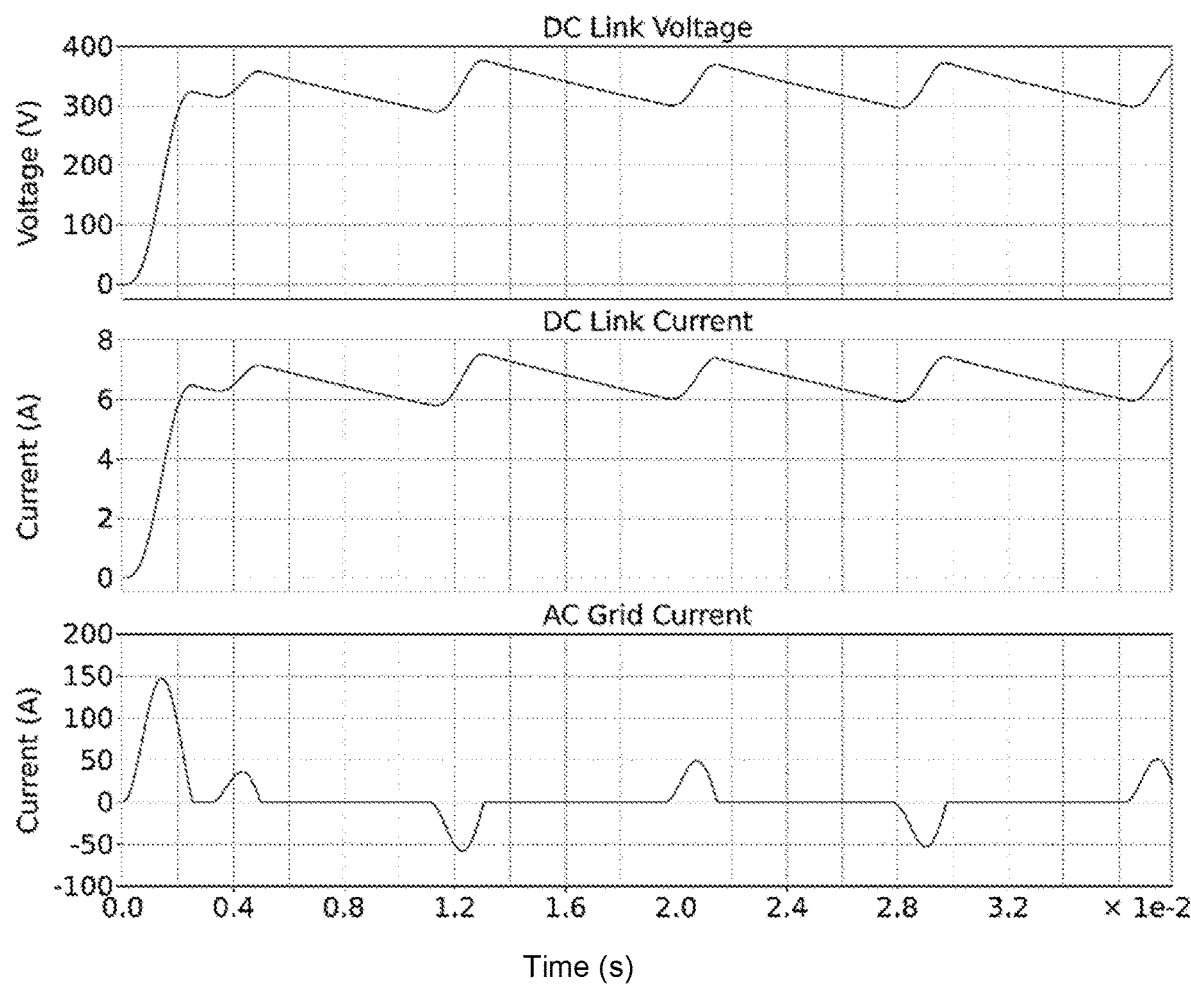
FIG. 3 illustrates an example of startup voltage and currents of a traditional power converter including freewheeling diodes, in accordance with various embodiments of the present disclosure.

Simulation results performed using Plecs simulation indicate that active switch devices 100 offer good control of the current when compared to traditional circuit operation with freewheeling diodes. FIG. 3 illustrates start up voltage and currents in a traditional power converter including a simple H-bridge boost rectifier with freewheeling diodes. FIG. 3 shows the DC link voltage and current during a traditional circuit startup, and the corresponding AC grid current drawn by the power converter. As can be seen in FIG. 3, a very high in-rush current of 147 Amps charges the DC link almost instantaneously. After this initial surge, the DC bus is charged and the current flow through the diodes at steady state levels.

Figure 4A:
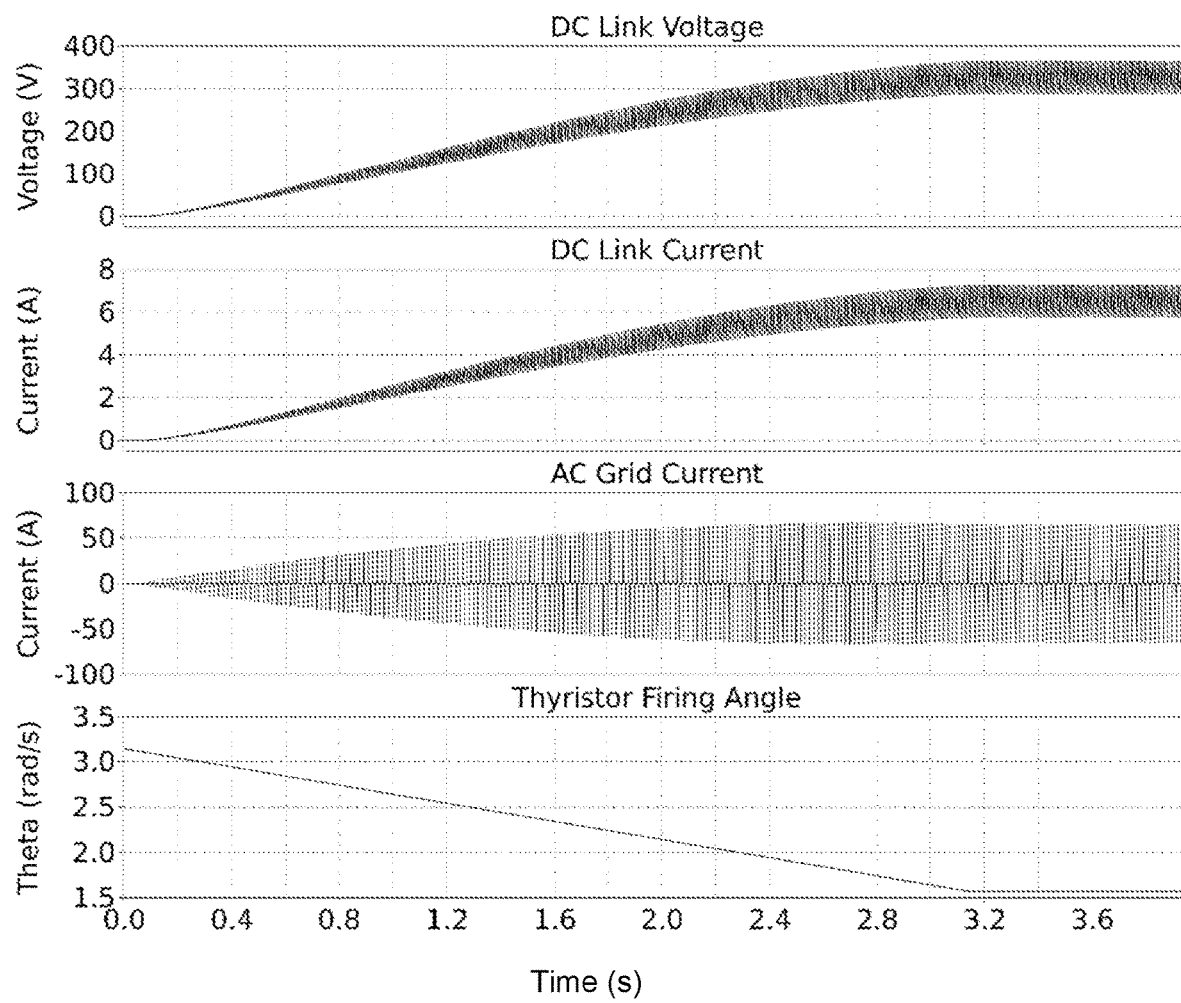
FIGS. 4A and 4B illustrate an example of startup voltage and currents of a power converter including active switch devices of FIGS. 1A and 1B, in accordance with various embodiments of the present disclosure.
Figure 4B:
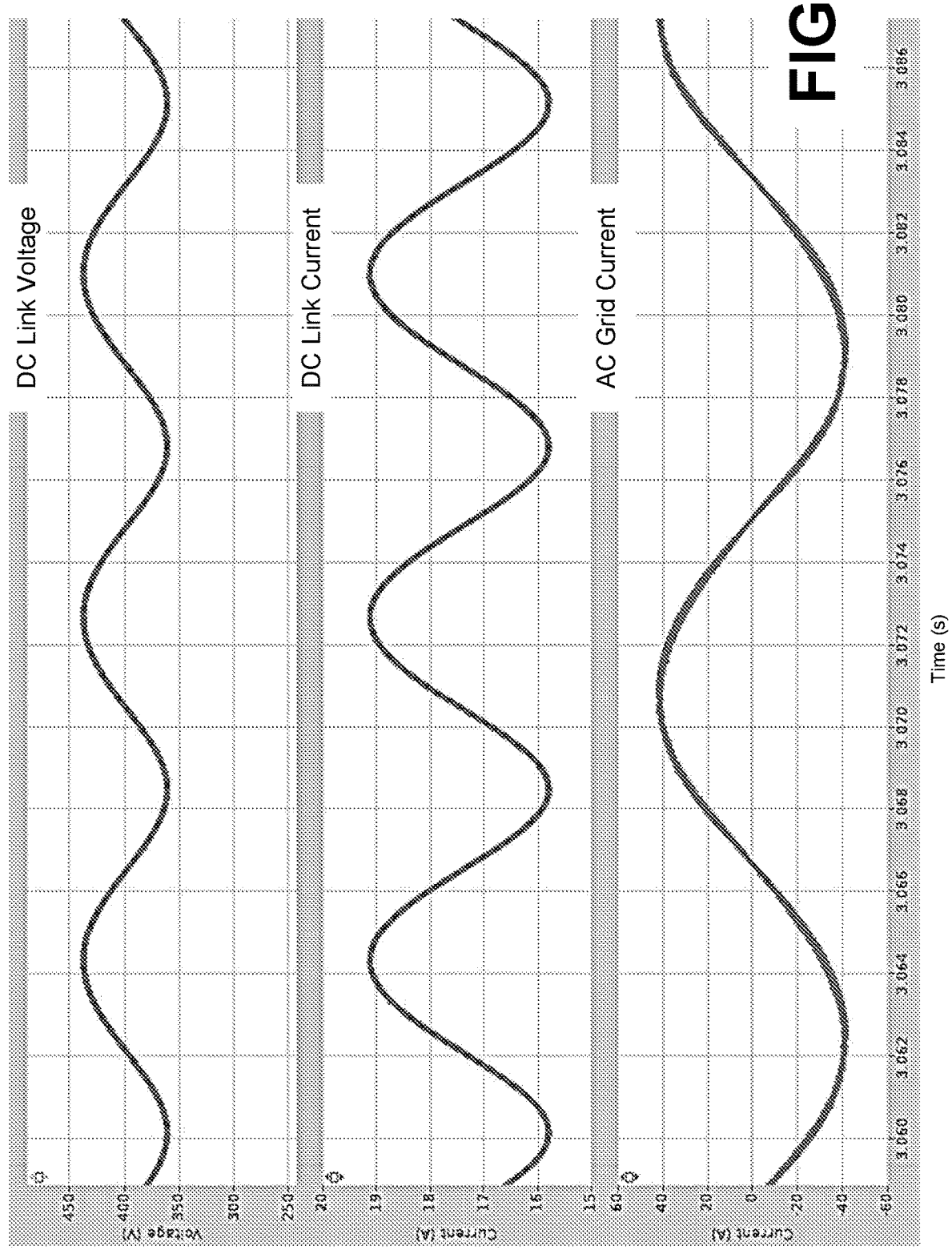

FIGS. 4A and 4B illustrate start up voltage and currents in a power converter including the H-bridge boost rectifier with active switching devices 100 (e.g., device 100a of FIG. 1A). In the simulation, the switching control circuitry gradually reduced the firing angle of the thyristors in the rectifier to enable a slow increase of the AC charging current. FIG. 4A shows the increase in the DC link voltage and current during the circuit startup with the controlled gating of the thrylstors based on the decreasing firing angle. As can be seen in FIG. 4A, the AC grid current gradually increases with the firing angle until a steady state condition is reached. FIG. 4B shows the steady state DC link voltage and current, and the AC grid current, with an expanded time scale. The thyristors behave just as the diodes do when their firing signal is held on. This enable the steady state operation of the freewheeling diode and thyristor based circuits to be indistinguishable even when the active switches (e.g., IGBTs) are gating on for the boost rectifier.

Figure 5:
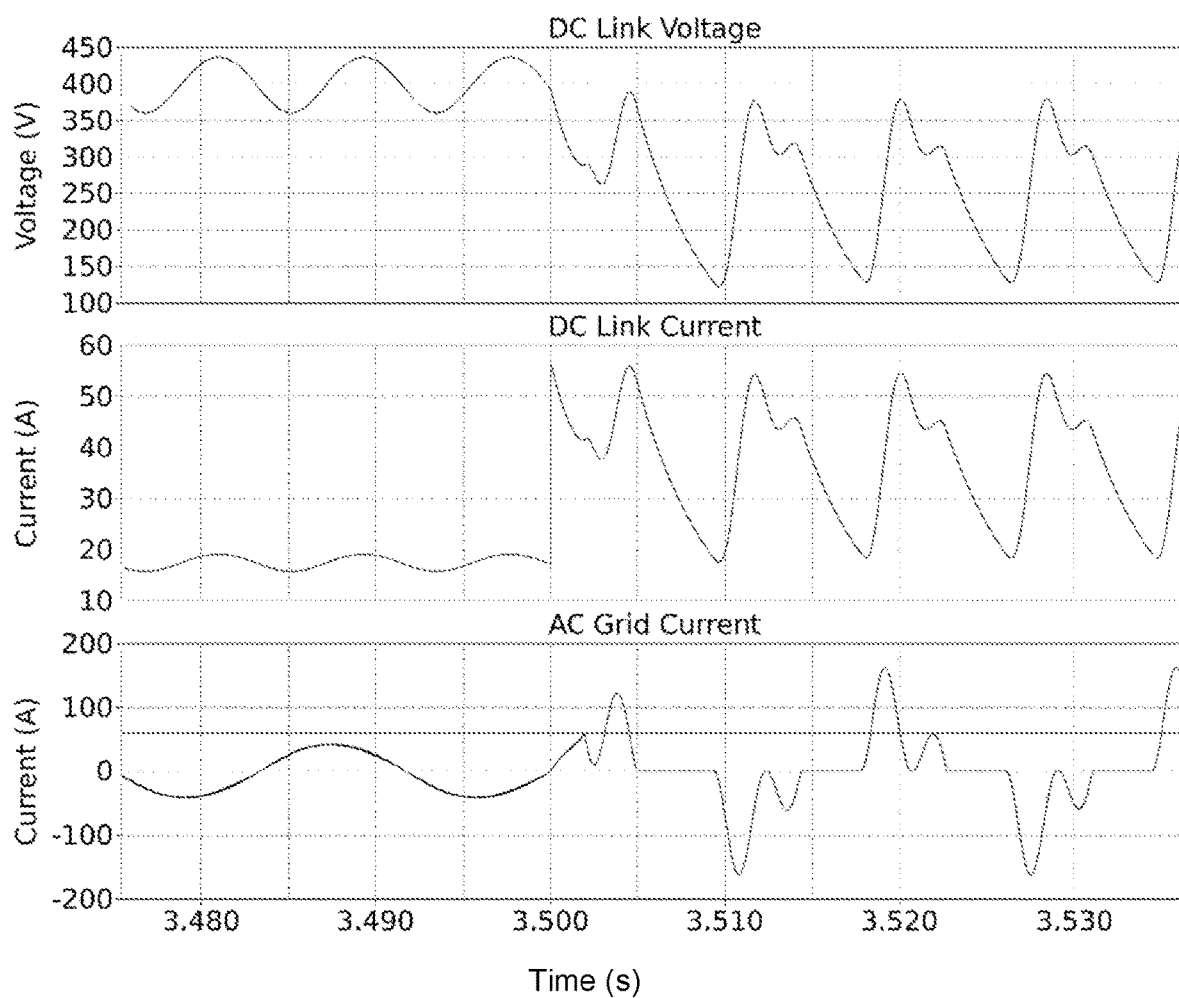
FIG. 5 illustrates an example of fault voltage and currents of a traditional power converter including freewheeling diodes, in accordance with various embodiments of the present disclosure.

FIG. 5 illustrates fault condition voltage and currents in the traditional power converter including the H-bridge boost rectifier with freewheeling diodes. One of the drawbacks of traditional voltage source converters is the inability quickly stop faults. Generally, an additional relay or circuit breaker is needed that can handle these fault conditions. FIG. 5 shows the DC link voltage and current before and after a fault is experienced, and the corresponding AC grid current drawn by the power converter.

As can be seen in FIG. 5, the IGBTs are cut off when the current reaches a 60 Amp trip threshold. However, because of the freewheeling diodes, fault current continues to be supplied by the power converter, producing current spikes on both the DC link and in the AC grid current. This will continue until a circuit breaker is tripped and the AC source is disconnected from the power converter. This can have a cascade effect as circuit breakers generally feed multiple loads and systems and everything downstream will also be disconnected.

Figure 6:
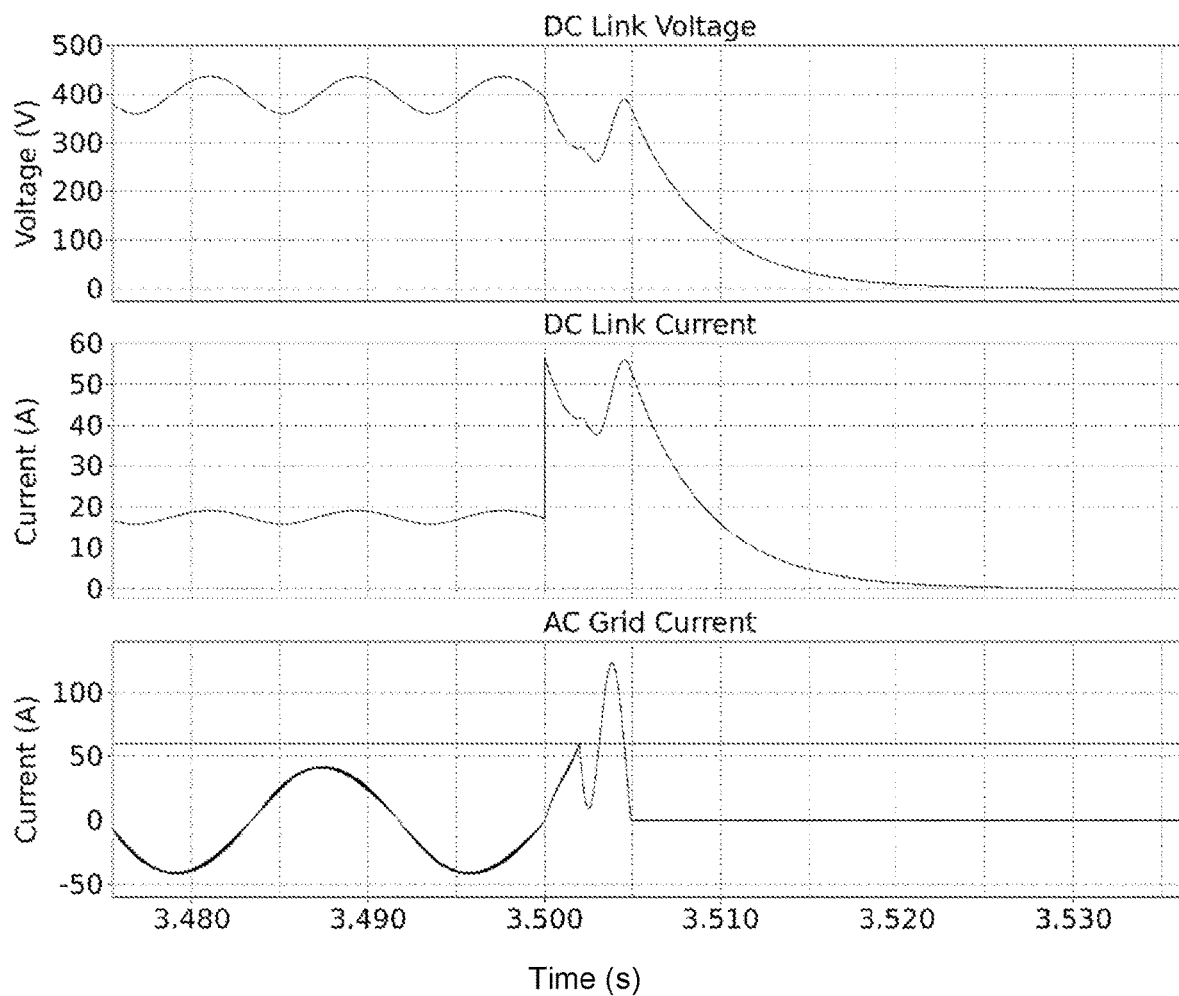
FIG. 6 illustrates an example of fault voltage and currents of a power converter including active switch devices of FIGS. 1A and 1B, in accordance with various embodiments of the present disclosure.

FIG. 6 illustrates fault condition voltage and currents in the power converter including the H-bridge boost rectifier with active switching devices 100 (e.g., device 100a of FIG. 1A). One of the advantages of the thyristor in parallel with the active switch is the ability to discontinue gating during a fault condition. This means that once tripped, a fault can be cleared in at most one half cycle of the AC source. As can be seen in FIG. 6, the AC grid current goes to zero in less than one half cycle, and the DC link voltage and current are allowed to collapse to zero. The switching control circuitry can be configured to provide appropriate gating signals to the active switches and thyristors in response to a sensed fault condition.

An additional advantage of this operational control is that only the power converter is disconnected from the AC source leaving all other loads unaffected. The disclosed active switch device topology not only clears faults quickly but has a reasonable chance of reducing the maximum fault current experienced by the power converter and AC grid. This is because only the remainder of a half cycle will feed the fault. If the system is tripped after peak voltage, the resulting maximum fault current will be less than a traditional circuit which experiences a 'second dose' of fault current on the next half cycle.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. An active switch device, comprising:
an active switch comprising a collector or source, an emitter or drain, and a gating control input; and
a thyristor comprising a cathode, an anode, and a gating control input, the thyristor coupled in parallel with the active switch with the cathode of the thyristor electrically connected to the collector or source of the active switch, where switching control circuitry provides a gate signal to the gating control input of the thyristor to control a firing angle of the thyristor in response to a charge on a DC bus.

2. The active switch device of claim 1, wherein the active switch is an insulated-gate bipolar transistor (IGBT) comprising the collector and emitter.

3. The active switch device of claim 2, wherein the anode of the thyristor is electrically connected to the emitter of the IGBT.

4. The active switch device of claim 1, wherein the active switch is a metal-oxide-semiconductor field-effect transistor (MOSFET) comprising the source and drain.

5. The active switch device of claim 4, wherein the anode of the thyristor is electrically connected to the drain of the MOSFET.

6. The active switch device of claim 4, comprising an enable switch connected in series with the MOSFET, wherein the thyristor is coupled in parallel with the active switch and the enable switch.

7. The active switch device of claim 1, wherein the gate signal provides a ramp increase in response to the charge on the DC bus.

8. The active switch device of claim 7, wherein the gate signal is held at a constant level when the DC bus charge reaches a defined level.

9. An active switch device, comprising:
an active switch comprising a gating control input; and
a thyristor comprising a gating control input, the thyristor coupled in parallel with the active switch, wherein switching control circuitry provides a gate signal to the gating control input of the thyristor to control a firing angle of the thyristor, the gate signal providing a ramp increase in response to a charge on a DC bus, and the switching control circuitry provides a second gate signal to the gating control input of the active switch for pulse width modulation (PWM) operation while the firing angle of the thyristor is held constant.

10. The active switch device of claim 7, wherein the switching control circuitry turns off the thyristor in response to detection of a fault condition on the DC bus.

11. The active switch device of claim 10, wherein the fault condition is a current threshold.

12. A power converter, comprising:
active switch devices comprising:
an active switch comprising a gating control input; and
a thyristor comprising a gating control input, the thyristor coupled in parallel with the active switch; and
switching control circuitry coupled to gating control inputs of the active switch devices, the switching control circuitry controlling firing angles of thyristors of the active switch devices in response to a charge on a DC bus electrically connected to the active switch devices.

13. The power converter of claim 12, wherein the switching control circuitry controls the firing angles of the thyristors of the active switch devices in response to one or more additional operational conditions of the power converter.

14. The power converter of claim 12, wherein the firing angles of the thyristors are decreased over a period of time in response to starting of the power converter.

15. The power converter of claim 14, wherein the firing angles are linearly decreased over a defined period of time.

16. The power converter of claim 14, wherein the firing angles are decreased from pi radians.

17. The power converter of claim 16, wherein the firing angles are decreased to zero radians at steady state operation.

18. The power converter of claim 13, wherein gating of the thyristors is de-energized in response to detection of a fault condition.

19. The power converter of claim 12, wherein the switching control circuitry turns off the thyristor of the active switch devices in response to detection of a fault condition.

* * * * *